US011340383B2

(12) United States Patent
Dunn et al.

(10) Patent No.: US 11,340,383 B2
(45) Date of Patent: May 24, 2022

(54) HYDROXIDE-CATALYSIS BONDING OF OPTICAL COMPONENTS USED IN DUV OPTICAL SYSTEMS

(71) Applicant: Corning Incorporated, Corning, NY (US)

(72) Inventors: Michael Morgan Dunn, Palmyra, NY (US); Todd Robert McMichael, Rochester, NY (US); Paul Francis Michaloski, Rochester, NY (US); Mark Ranney Westcott, Rochester, NY (US)

(73) Assignee: Corning Incorporated, Corning, NY (US)

( * ) Notice: Subject to any disclaimer, the term of this patent is extended or adjusted under 35 U.S.C. 154(b) by 815 days.

(21) Appl. No.: 16/156,210

(22) Filed: Oct. 10, 2018

(65) Prior Publication Data

US 2019/0137656 A1 May 9, 2019

Related U.S. Application Data

(60) Provisional application No. 62/582,523, filed on Nov. 7, 2017.

(51) Int. Cl.
*G02B 1/02* (2006.01)
*G02B 3/00* (2006.01)
(Continued)

(52) U.S. Cl.
CPC ............... *G02B 1/02* (2013.01); *C03B 23/22* (2013.01); *C03C 27/00* (2013.01); *G02B 3/00* (2013.01);
(Continued)

(58) Field of Classification Search
CPC .. G02B 1/041; G02B 13/143; G02B 17/0892; G02B 1/02; G02B 21/16; G02B 5/208;
(Continued)

(56) References Cited

U.S. PATENT DOCUMENTS

| 6,284,085 B1 | 9/2001 | Gwo |
| 6,548,176 B1 | 4/2003 | Gwo |

(Continued)

OTHER PUBLICATIONS

Burnett et al; "Symmetry of Spatial-Dispersion-Induced Birefringence and Its Implications for CaF2 Ultraviolet Optics"; J. Microlighography, Microfabrication, Microsystems, vol. 1, Iss. 3, pp. 213-224, (2002)).

(Continued)

*Primary Examiner* — Collin X Beatty
*Assistant Examiner* — Grant A Gagnon
(74) *Attorney, Agent, or Firm* — Amy T. Lang; Kevin L. Bray

(57) ABSTRACT

A compound lens assembly and method for making a compound lens assembly useful for deep ultraviolet lithography are described. The compound lens assembly includes a first lens component having an optical surface bonded to an optical surface of a second lens component. The bonding at the interface can be achieved using a hydroxide catalysis bonding technique. The compound lens assembly and process for making same solve problems relating to constringence and/or inherent birefringence known for conventional optical elements used in deep ultraviolet lithography or inspection of wafers or reticles in the DUV.

21 Claims, 2 Drawing Sheets

(51) Int. Cl.
*G02B 7/20* (2021.01)
*C03B 23/22* (2006.01)
*G03F 7/20* (2006.01)
*C03C 27/00* (2006.01)

(52) U.S. Cl.
CPC ...... *G03F 7/70158* (2013.01); *G03F 7/70966* (2013.01); *G02B 2003/0093* (2013.01)

(58) Field of Classification Search
CPC ...... G02B 17/0812; G02B 1/08; G02B 1/115; G02B 27/0018; G02B 17/08; G02B 17/0896; G02B 27/0025; G02B 3/00; G02B 3/08; G02B 13/0085; G02B 13/14; G02B 13/146; G02B 17/0856; G02B 19/0014; G02B 19/0095; G02B 1/113; G02B 21/04; G02B 27/0966; G02B 3/0031; G02B 3/005; G02B 3/0075; G02B 5/3083; G02B 13/003; G02B 13/0045; G02B 13/022; G02B 19/0052; G02B 21/0076; G02B 21/33; G02B 27/0006; G02B 27/0031; G02B 27/0075; G02B 27/1006; G02B 27/286; G02B 3/0012; G02B 3/0062; G02B 3/0087; G02B 5/003; G02B 5/005; G02B 5/282; G02B 5/283; G02B 5/3091; G02B 7/02; G02B 7/021; G02B 7/026; G02B 13/0015; G02B 13/0025; G02B 13/0095; G02B 13/18; G02B 15/1461; G02B 15/177; G02B 17/023; G02B 17/0663; G02B 17/0808; G02B 17/0816; G02B 17/086; G02B 19/0042; G02B 1/00; G02B 1/04; G02B 1/10; G02B 1/11; G02B 2027/0138; G02B 21/0032; G02B 21/0036; G02B 21/0072; G02B 25/02; G02B 26/0833; G02B 26/105; G02B 27/0101; G02B 27/0172; G02B 27/0905; G02B 27/0961; G02B 27/123; G02B 27/14; G02B 27/141; G02B 27/28; G02B 27/4205; G02B 27/4211; G02B 27/4222; G02B 27/4233; G02B 27/4272; G02B 27/44; G02B 30/27; G02B 3/0037; G02B 3/04; G02B 3/06; G02B 3/14; G02B 5/008; G02B 5/02; G02B 5/0891; G02B 5/1809; G02B 5/1838; G02B 5/1842; G02B 5/1871; G02B 5/1876; G02B 5/1895; G02B 5/223; G02B 5/226; G02B 5/23; G02B 5/281; G02B 5/286; G02B 6/102; G02B 6/4206; G02B 6/4207; G02B 6/421; G02B 6/4246; G02B 6/4292; G02B 6/4296; G02B 7/022; G02B 7/025; G02B 7/027; G02B 7/08; G02B 7/102; G02B 9/06; G02B 9/08; G02B 9/62; G03F 7/70225; G03F 7/70958; G03F 7/70341; G03F 7/70966; G03F 1/84; G03F 7/70275; G03F 7/70075; G03F 7/70191; G03F 7/70616; G03F 7/7065; G03F 1/60; G03F 7/70316; G03F 7/70483; G03F 7/70916; G03F 1/24; G03F 1/72; G03F 7/0005; G03F 7/70025; G03F 7/70033; G03F 7/70083; G03F 7/70141; G03F 7/702; G03F 7/70216; G03F 7/70233; G03F 7/70241; G03F 7/70291; G03F 7/70308; G03F 7/70558; G03F 7/70566; G03F 7/70575; G03F 7/70591; G03F 7/706; G03F 7/70666; G03F 7/70808; G03F 7/70825; G03F 7/70891; G03F 7/70925; G03F 7/70941; G03F 7/70983; C03C 3/06; C03C 21/008; C03C 2201/21; C03C 2201/23; C03C 3/11; C03C 4/085; C03C 13/047; C03C 14/006; C03C 2201/10; C03C 2201/11; C03C 2201/12; C03C 2201/22; C03C 2201/24; C03C 2201/32; C03C 2201/3411; C03C 3301/3441; C03C 2201/40; C03C 2201/50; C03C 2214/16; C03C 2214/30; C03C 3/068; C03C 3/087; C03C 3/118; C03C 3/17; C03C 4/0085; C03C 4/082; C03B 2201/21; C03B 11/082; C03B 19/1453; C03B 2201/07; C03B 2201/075; C03B 2201/10; C03B 2201/12; C03B 2201/22; C03B 2201/23; C03B 2201/24; C03B 2201/32; C03B 2201/34; C03B 2201/40; C03B 2215/414
USPC .......................................................... 359/355
See application file for complete search history.

(56) References Cited

U.S. PATENT DOCUMENTS

2004/0021943 A1 2/2004 Sewell
2009/0294050 A1 12/2009 Traggis et al.
2017/0275690 A1* 9/2017 Dehlinger ............ G02B 21/361

OTHER PUBLICATIONS

International Search Report and Written Opinion PCT/US2018/058105 dated Feb. 5, 2019, 12 Pgs.

* cited by examiner

HYDROXIDE-CATALYSIS BONDING OF OPTICAL COMPONENTS USED IN DUV OPTICAL SYSTEMS

This application claims the benefit of priority to U.S. Provisional Application Ser. No. 62/582,523 filed on Nov. 7, 2017, the content of which is relied upon and incorporated herein by reference in its entirety.

FIELD OF THE DISCLOSURE

This disclosure relates to the field of optics, and more particularly to optics used in deep ultraviolet (DUV) lithography which employ a calcium fluoride lens component.

BACKGROUND OF THE DISCLOSURE

Photolithography refers to processes used in the fabrication of microscopic and nanoscopic structures on various substrate materials to produce micro-optics components, semiconductor devices, micro-electro-mechanical systems (MEMS), microfluidic devices, and other miniaturized devices. These processes employ light to transfer a geometric pattern from a photomask to a light-sensitive material, referred to as a photoresist, that is disposed on a substrate (often referred to as a wafer). The portions of the photoresist that have been exposed to the light are chemically changed. For a positive photoresist, the exposed portions become soluble to a developer solution and are etched away, whereas for a negative photoresist, the exposed portions become insoluble to a developer and the unexposed portions are etched away.

The ability to project a clear image of a small feature onto the wafer is limited by the wavelength of the light used, and the ability of the reduction lens system to capture sufficient diffraction orders from the illuminated photomask. Current state of the art photolithography tools use deep ultraviolet (DUV) light from excimer lasers. The minimum feature size that can be printed on a photoresist is proportional to the wavelength of the light illuminating the photomask and inversely proportional to the numerical aperture (NA). Thus, it is desirable to use the smaller wavelengths of light generated by deep ultraviolet lasers with a reduction lens system having a high numerical aperture.

A problem in providing a reduction lens system for use in deep ultraviolet photolithography arises from the fact that there are a limited number of materials that are suitable for focusing DUV radiation. The most, or perhaps only, practical materials for such lens systems are calcium fluoride and fused silica. Generally, it is relatively easy to correct chromatic aberration resulting from dispersion (the variation of refractive index with wavelength) of light in the visible light spectrum (about 400-700 nm) using glass types having large differences in constringence or dispersion as characterized by Abbe v-number. However, because calcium fluoride and fused silica have small differences in their Abbe v-numbers, correction for chromatic color aberration of DUV photolithographic reduction lens systems has required small radius (highly curved) lenses and air-spaced doublets (a lens system made of two simple lenses paired together) with high incidence angles. These conditions place extreme demands on thin film coatings (e.g., antireflective coatings) to achieve system transmission and pupil transmission uniformity specifications. A bonded CaF2/Fused Silica doublet can achromatize and has much lower angles of incidence than an air spaced doublet.

A further problem that can arise in providing a reduction lens system for use in deep ultraviolet photolithography, especially for photolithographic apparatus employing the $F_2$ excimer laser (generating light having a wavelength of 157 nm), is that light transmission through standard fused silica can be unacceptably low, requiring a doublet comprising two calcium fluoride lenses. A previously unresolved problem associated with such doublets relates to an optical aberration caused by the directionally dependent intrinsic birefringence of calcium fluoride.

An additional problem relating to the use of excimer and other laser sources using a calcium fluoride lens for correction of chromatic aberrations is that the birefringence of the calcium fluoride lens reduces polarization purity, which must be maintained for many schemes for inspection of wafers and reticles. An optical path is polarization pure if the output polarization state matches the input polarization state. The degree of polarization purity can be measured as the degree of polarization retardance along that path.

SUMMARY OF THE DISCLOSURE

Disclosed are interfacially-bonded doublet and triplet optic lens systems comprising at least a first calcium fluoride lens component having an optical surface that is bonded to a conforming optical surface of at least a second lens component that can be comprised of calcium fluoride or a silica-containing material. This bonding can be achieved through hydroxide-catalyzed hydration and dehydration (also known as "hydroxide catalysis bonding"). The resulting bond can be comprised of Ca—O—Si or Ca—O—Ca bridges between the lens components.

Also disclosed are interfacially bonded doublet and triplet optic lens systems comprising at least a first lens component having a convex spherical optical surface that is bonded to at least a second lens component having a conforming concave spherical optical surface using hydroxide-catalyzed hydration and dehydration (hydroxide catalysis bonding). The cross-over between convex and concave surfaces are plano surfaces that can also be bonded in this manner. Thus, the expression "spherical optical surface" encompasses planar surfaces, which can be regarded as spherical surfaces with infinite radius.

Also disclosed are processes of assembling an interfacially-bonded doublet or triplet optic lens system comprising at least a first calcium fluoride lens component having an optical surface that is bonded to a conforming optical surface of at least a second lens component that is comprised of calcium fluoride or a silica-containing material. The process includes providing at least a first calcium fluoride lens component having an interfacial optical surface, providing a second lens component having an interfacial optical surface, and bonding the interfacial optical surface of the first calcium fluoride lens component with the interfacial optical surface of the second lens component by Ca—O—Si or Ca—O—Ca bridges between the lens components.

In certain embodiments, the lens assembly includes a first optical component having a first surface comprising a metal halide $MX_n$ and a second optical component having a second surface forming an interface with the first surface, the interface including a covalent bond between the first surface and the second surface. The second optical component comprises a metal halide $M'X'_m$ or a silica-containing material, wherein when the second optical component comprises $M'X'_m$, the covalent bond includes a M-O-M' bridge and wherein when the second optical component comprises a silica-containing material, the covalent bond includes a M-O—Si bridge.

In certain embodiments, the process for making the compound lens assembly includes providing a first optical component having a first surface comprising a metal halide $MX_n$; providing a second optical component having a second surface comprising a metal halide $M'X'_m$ or a silica-containing material, wherein when the second optical component comprises $M'X'_m$, the covalent bond includes a M-O-M' bridge and wherein when the second optical component comprises a silica-containing material, the covalent bond includes a M-O—Si bridge; applying a hydroxide solution to one or both of the first and second optical surfaces; forming an interface between the first and second optical surfaces, wherein the hydroxide solution induces hydration of the surfaces and formation of surface hydroxyl groups; and dehydrating the interfacing surfaces to form a covalent bond between the first and second optical surfaces.

In other embodiments, the lens assembly includes a first optical component composed of silica or $MX_n$, wherein M is a Group 1 or Group 2 metal, X is a halide, and n is 1 if M is a Group 1 metal and n is 2 if M is a Group 2 metal, the first optical component having a convex spherical interfacial surface; and a second optical component composed of silica or $M'X'_m$, wherein M' is a Group 1 or Group 2 metal, X' is a halide, and m is 1 if M' is a Group 1 metal and m is 2 if M' is a Group 2 metal, the second optical component having a concave spherical interfacial surface covalently bonded with the convex spherical interfacial surface of the first optical component by an Si—O—Si, M-O—Si or M-O-M' bridge, wherein M and M' can be the same or different and X and X' can be the same or different.

The present description extends to:
A lens assembly with an optical axis, comprising:
 a first optical component, the first optical component having a first optical surface and comprising a metal halide $MX_n$; and
 a second optical component having a second optical surface forming an interface with the first optical surface of the first optical component, the interface including a covalent bond between the first optical surface and the second optical surface, the second optical component comprising a metal halide $M'X'_m$ or a silica-containing material;
 wherein when the second optical component comprises $M'X'_m$, the covalent bond includes a M-O-M' bridge; and
 wherein when the second optical component comprises a silica-containing material, the covalent bond includes a M-O—Si bridge.

The present description extends to:
A process for making a compound lens assembly having an optical axis comprising:
 providing a first optical component having a first optical surface comprising a metal halide $MX_n$;
 providing a second optical component having a second optical surface comprising a metal halide $M'X'_m$ or a silica-containing material;
 applying a hydroxide solution to one or both of the first and second optical surfaces;
 forming an interface between the first and second optical surfaces, wherein the hydroxide solution induces hydration of one or both of the first and second optical surfaces and formation of hydroxyl groups on one or both of the first and second optical surfaces; and
 dehydrating the interfacing first and second optical surfaces to form a covalent bond between the first and second optical surfaces, wherein when the second optical component comprises $M'X'_m$, the covalent bond includes a M-O-M' bridge; and wherein when the second optical component comprises a silica-containing material, the covalent bond includes a M-O—Si bridge.

The present description extends to:
A lens assembly, comprising:
 a first optical component composed of silica or $MX_n$, wherein M is a Group 1 or Group 2 metal, X is a halide, and n is 1 if M is a Group 1 metal and n is 2 if M is a Group 2 metal, the first optical component having a convex spherical interfacial surface; and
 a second optical component composed of silica or $M'X'_m$, wherein M' is a Group 1 or Group 2 metal, X' is a halide, and m is 1 if M' is a Group 1 metal and m is 2 if M' is a Group 2 metal, the second optical component having a concave spherical interfacial surface covalently bonded with the convex spherical interfacial surface of the first optical component by an Si—O—Si, M-O—Si or M-O-M' bridge, wherein M and M' can be the same or different and X and X' can be the same or different.

DESCRIPTION OF PARTICULAR EMBODIMENTS

It has been determined that hydroxide catalysis bonding to make doublet or triplet lens assemblies comprising at least a first lens component composed of calcium fluoride and at least a second lens component comprised of calcium fluoride or a silica-containing material offers lens designers many new options for countering the effects of intrinsic birefringence, and/or countering chromatic aberration, in lens systems using calcium fluoride lens components. Such options were not previously possible because conventional optical adhesives, such as epoxy resin-type adhesives, are not compatible with deep ultraviolet lens designs due to high transmission losses.

Silica-containing materials include fused silica, binary and higher silica glasses, and silicon-containing oxide crystals (e.g. silicates).

By producing doublet (and higher) compound lens assemblies having one or more pairs of interfacing optical surfaces bonded together using a hydroxide catalysis bonding technique, the need for coating the interfacing surfaces is eliminated and the air space between the lens components of a compound lens assembly is eliminated, reducing transmission losses and providing improved pupil uniformity. In some embodiments, the interfacing optical surfaces are spherical or nearly spherical surfaces, meaning that the surface has contours of a portion of a sphere. In other embodiments, the interfacing optical surfaces are planar or non-spherically curved.

Conventional optical adhesives, such as epoxy resins, mercapto-ester resins and other organic resin adhesive systems have not been acceptable for producing compound lens assemblies used in deep ultraviolet optics, such as doublet and triplets, in which the adhesive is used to bond the lens components at interfacing optical surfaces due to excessive absorption, chemical changes and low transmission at the interface(s).

Figure 1:
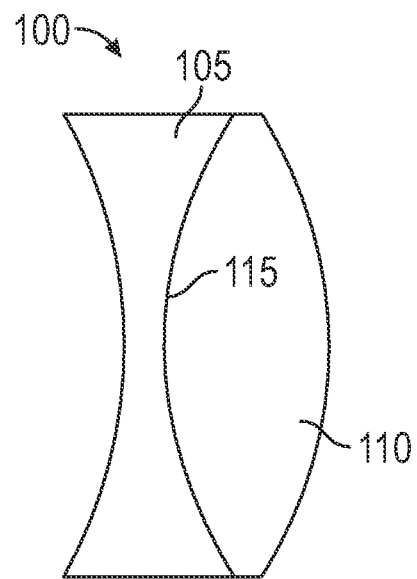
FIG. 1 is a side elevational view of a doublet lens assembly comprised of a biconcave lens component interfaced with a biconvex lens component.

FIG. 1 illustrates a compound lens assembly 100 comprising a biconcave lens component 105 bonded with a biconvex lens component 110 at an interface 115 between conforming (i.e., matching) optical surfaces of the respective components 105, 110. The interfacial bonding comprises Ca—O—Si bridges when one of the components 105, 110 is made of calcium fluoride and the other is made of a silica-containing material. The bonding at interface 115 comprises Ca—O—Ca bridges when both components 105, 110 are made of calcium fluoride. In either case, bonding of the components 105, 110 is achieved using a hydroxide catalysis bonding technique.

Figure 2:
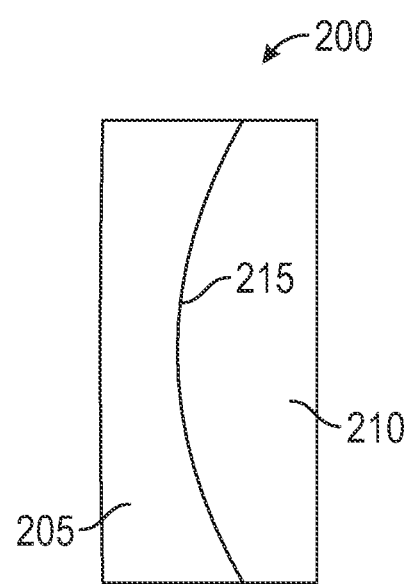
FIG. 2 is a side elevational view of a doublet lens assembly comprised of a plano-concave lens component interfaced with a plano-concave lens component.

FIG. 2 illustrates a compound lens assembly 200 comprising a plano-concave lens component 205 bonded with a plano-convex lens component 210 at an interface 215 between conforming spherical optical surfaces of the respective components 205, 210. The interfacial bonding comprises Ca—O—Si bridges when one of the components 205, 210 is made of calcium fluoride and the other is made of a silica-containing material. The bonding at interface 215 comprises Ca—O—Ca bridges when both components 205, 210 are made of calcium fluoride. In either case, bonding of the components 205, 210 is achieved using a hydroxide catalysis bonding technique.

In general, deep ultraviolet optics made of calcium fluoride are configured with the <111> plane normal to the optical axis of the optical component. The intrinsic birefringence of a calcium fluoride optical component increases as the angle between a light ray and a normal to the <111> plane increases up to about a 35 degree angle. The birefringence is highest in three clocking directions around the optical axis of the component, such that the angles of peak birefringence are separated by 120 degrees along the azimuth.

John Burnett et al., "Symmetry of spacial-dispersion-induced birefringence and its implication for $CaF_2$ ultraviolet optics," J. Microlith., Microfab., Microsyst., Vol. 1 No. 3, October 2002, teaches that the spatial-dispersion-induced birefringence (intrinsic birefringence) in $CaF_2$ at ultraviolet wavelengths can severely degrade the performance of precision optics, and that such systems must be designed to compensate or correct for this intrinsic birefringence. Light entering a birefringent crystal, such as $CaF_2$, splits into two propagating eigenstates with orthogonal linear polarizations and different propagation directions. Burnett et al. proposed compensating for intrinsic birefringence by combining lenses with different crystal axis orientations. For example, for light traveling symmetrically through a <111>-oriented first lens will have a threefold symmetry, and a second <111>-oriented lens with its transverse crystal axes rotated relative to those of the first lens by an odd multiple of 60 degrees will partially compensate for the azimuthal variation in the relative phase retardation. Similarly, a fourfold symmetric azimuthal variation in the relative phase retardation resulting from light traveling through a <001>-oriented lens can be partially compensated by a second <001>-oriented lens with its transverse crystal axes rotated by an odd multiple of 45 degrees. These effects can be combined to nearly perfectly compensate for intrinsic birefringence, and commercially available software is available to select appropriate crystal orientation clocking to reduce or substantially eliminate aberrations caused by intrinsic birefringence in optical crystal lens systems, such as those employing $CaF_2$ lens. Selection of appropriate and optimal clocking schemes for correcting intrinsic birefringence in a multi-element optical system or components thereof is well known in the art and does not, by itself, constitute an aspect of the novel embodiments of this disclosure.

In aspects of this disclosure, intrinsic birefringence effects are corrected or reduced in a compound lens assembly comprising calcium fluoride lens components by bonding two calcium fluoride lens components together at respective optical surfaces with a 60 degree clocking between them using hydroxide catalysis bonding to form an interfacial bond comprised of Ca—O—Ca bridges, so the peak of intrinsic birefringence in a first lens component aligns with the valley of intrinsic birefringence in a second lens component of a compound lens assembly. This arrangement has the effect of reducing birefringence to less than half of the maximum birefringence. By taking into account the other possible $CaF_2$ elements in the optical system, such as imaging lens, the optimum rotation of any one $CaF_2$ pair might not be 60° to obtain the optimum system performance. The determination of the optimum clocking can be achieved in lens design programs that include ray tracing of crystal birefringence in mediums. An example of such commercially available software is CodeV.

Figure 3:
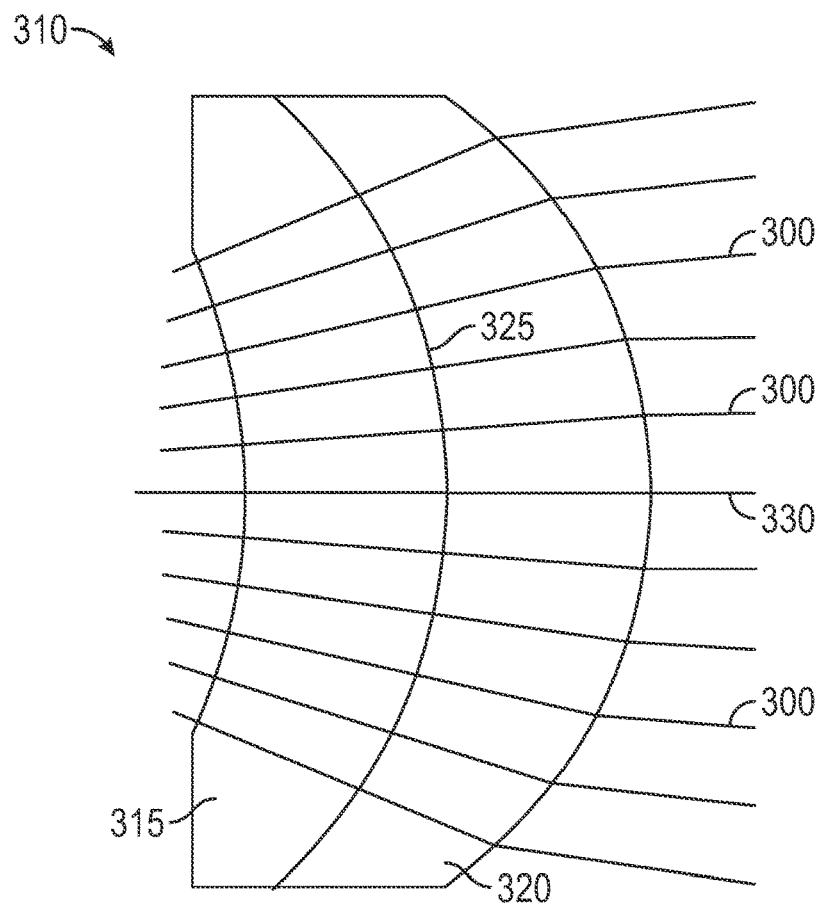
FIG. 3 is a side elevational view of a doublet lens assembly comprised of a first positive meniscus lens component interfaced with a second positive meniscus lens component.

FIG. 3 shows light rays 300 passing through a compound lens assembly 310 comprised of two calcium fluoride positive meniscus spherical lens components 315, 320 bonded at an interface 325 by Ca—O—Ca bridges, which are formed using a hydroxide catalysis bonding technique. By arranging the components 315, 320 so that the <111> planes of the lens components 315, 320 are normal to the optical axis 330, and the peak intrinsic birefringence of one lens component (e.g., 315) is rotationally aligned with the valley of intrinsic birefringence of the other lens component (e.g., 320) of the compound lens assembly 310, light rays 300 will have paths that are greatly improved in polarization purity for this particular doublet alone. As an example, if the path length of a ray is equal in both components 315 and 320 with the same material type, and the clocking of the retardation in component 320 is 90° to component 315, then the birefringence of the path is summed to zero. Birefringence along a path will have a difference of optical path length for orthogonal polarization states. The optical path lengths in birefringent medium of the two orthogonal polarization states are often referred to as the slow and fast path, referring to the amount of time it takes for the two orthogonal polarization states to transverse the medium. In a material like $CaF_2$, the maximum birefringence occurs for orthogonal polarization states that are linear, and the two orthogonal polarization states have a 90° clocking to the path. If the components 315 and 320 are clocked as described, then one component will have the fast path and one component will have the slow path for each of the orthogonal polarization states. In other words, each of the orthogonal polarization states will have a slow path in one of components 315 and 320 and a fast path in the other of components 315 and 320 that will combine to provide the same net path length through the combination of components 315 and 320, so that the optical path length and the time of traversal are equal through the assembly 310.

When this occurs, the polarization purity of all polarization states is maintained through the medium.

Figure 4:
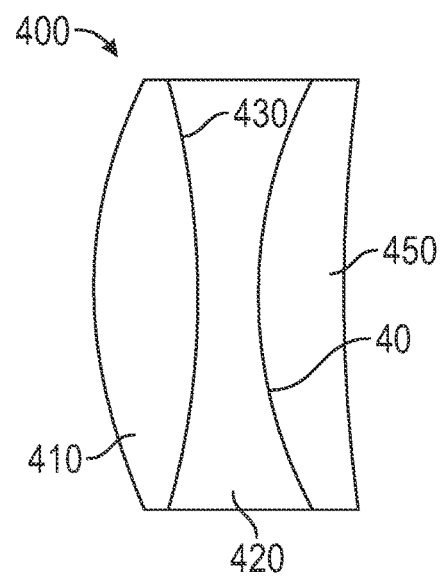
FIG. 4 is a side elevational view of a triplet lens assembly composed of a biconvex lens component joined to a first optical surface of a biconcave lens component, and a plano-convex lens component joined to a second optical surface of the biconcave lens component.

FIG. 4 illustrates a compound lens assembly 400 (a triplet) comprising a biconvex lens component 410 bonded with a first surface of a biconcave lens component 420 at an interface 430 between conforming optical surfaces, and a plano-convex lens component 450 bonded with a second surface of biconcave lens component 420 at a second interface 460 between conforming optical surfaces of components 420 and 450.

Hydroxide catalysis bonding is a technique for forming bonds between interfacing surfaces. The technique has heretofore been used to bond interfacing surfaces of oxide glasses and crystals (e.g. silica glass, silicate crystals, and metal oxide crystals). The bond is achieved by applying a hydroxide solution (e.g., at room temperature) to one or both surfaces that are to be interfaced, contacting the surfaces, and inducing a reaction between the surfaces to form a chemical bond that covalently links the surfaces. Hydroxide-catalyzed bonding can be used for covalently bonding together generally any two surfaces comprising an oxide or an oxidizable material. The hydroxide ion in the hydroxide solution catalyzes the bonding of oxides (e.g., fused silica) by breaking and hydrating an oxide linkage in a metal oxide to form hydroxyl groups on surfaces that are to be joined (e.g., $\equiv$Si—O—Si$\equiv$→2$\equiv$Si—OH). Upon contacting the surfaces, chemical bonding can occur via dehydration (e.g., $\equiv$Si—OH+HO—Si$\equiv$→$\equiv$Si—O—Si$\equiv$+$H_2O$). In the case of oxidizable materials, such as metal halides (e.g., MX) the hydroxide ion hydrates the surface of the oxidizable material (e.g., $MX+OH^-\rightarrow MOH+X^-$), which can be contacted with the surface of another hydrated oxidizable material or hydrated metal oxide to allow chemical bonding to occur via dehydration. Such hydroxide catalysis bonding techniques are also described in the open literature, such as in U.S. Pat. No. 6,548,176, the disclosure of which is hereby incorporated by reference in its entirety.

In accordance with the present disclosure, the hydroxide catalysis bonding technique has been extended to non-oxide glasses and crystals. In particular, hydroxide catalysis bonding of halide glasses and crystals has been demonstrated. In a preferred embodiment, hydroxide catalysis bonding is used to interface a lens component comprising a metal halide with a lens component comprising a metal halide or silica-containing material to form a compound lens assembly.

In one embodiment, hydroxide catalysis bonding is used to interface a first metal halide lens component with a second metal halide lens component. The two metal halide lens components may have the same composition or different compositions. A preferred metal halide is calcium fluoride ($CaF_2$) and in one embodiment, hydroxide catalysis bonding is used to interface two calcium fluoride lens components. Compound lens assemblies with one or more interfaces between two or more metal halide lens components formed by hydroxide catalyst bonding are within the scope of the present disclosure.

In another embodiment, hydroxide catalysis bonding is used to interface a metal halide lens component with a silica-containing lens component. A preferred metal halide is calcium fluoride ($CaF_2$) and a preferred silica-containing material is silica glass. In one embodiment, hydroxide catalysis bonding is used to interface a calcium fluoride lens component with a silica glass lens component. Compound lens assemblies with one or more interfaces between a metal halide lens component and a silica-containing lens component formed by hydroxide catalyst bonding are within the scope of the present disclosure. The present disclosure further extends to compound lens assemblies with one or more interfaces between a metal halide lens component and a silica-containing lens component formed by hydroxide catalyst bonding and one or more interfaces between two or more metal halide lens components.

Also disclosed is a process of making a compound lens assembly comprising a first calcium fluoride optical component, and a second optical component composed of calcium fluoride or silica (or a silica-containing material), which generally comprises providing the lens components with optical surfaces that are to be joined together, applying a hydroxide solution to one or both optical surfaces, aligning and contacting the optical surfaces, and forming a chemical bond that covalently links the optical surfaces. In one embodiment, the optical surfaces are matching optical surfaces. Matching optical surfaces are surfaces that, when brought together and properly aligned, touch or closely conform with each other along the interface between the surfaces, such that there are essentially no gaps between the surfaces after bonding.

The disclosed lens assemblies and processes are useful for correcting chromatic aberration, intrinsic birefringence and/or deviations from polarization purity for lens systems (e.g., interfacing doublets or triplets) comprising metal-halide and/or silica-containing lens components having interfacing optical surfaces. In one embodiment, the interfacing optical surfaces are spherical optical surfaces. Such corrections can be efficaciously achieved by using hydroxide catalysis bonding techniques to bond together optical surfaces of optical components comprised of silica, a silica-containing material, a Group 1 metal halide or a Group 2 metal halide. A Group 1 or Group 2 metal halide optical component can be bonded to a silica optical component by Si—O-M bridges, wherein M is either a Group 1 metal or a Group 2 metal. A metal halide optical component can be bonded to the same or a different metal halide optical component by M-O-M' bridges, wherein M and M' are each a Group 1 or Group 2 metal, and can be the same or different. Metal halide optical components that can bond together using hydroxide catalysis techniques can be represented by the formulae $MX_n$ and $M'X'_m$, respectively, wherein M and M' can be the same or different, n is 1 if M is a Group 1 metal and n is 2 if M is a Group 2 metal, m is 1 if M' is a Group 1 metal and m is 2 if M' is a Group 2 metal, X and X' can be the same or different, the X groups of $MX_n$ can be the same or different, and the X' groups of $M'X'_m$ can be the same or different. Examples of Group 1 metals include lithium, sodium, potassium and cesium. Examples of Group 2 metals include magnesium and calcium. Examples of halides include fluoride ($F^-$), chloride ($Cl^-$) and bromide ($Br^-$). Specific lens component materials include, for example, magnesium fluoride, lithium fluoride, calcium fluoride, magnesium chloride, and lithium chloride.

The described embodiments are preferred and/or illustrated, but are not limiting. Various modifications are considered within the purview and scope of the appended claims.

What is claimed is:

1. A lens assembly with an optical axis, comprising:
   a first optical component, the first optical component having a first optical surface and comprising a metal halide $MX_n$; and
   a second optical component having a second optical surface forming an interface with the first optical surface of the first optical component, the interface including a covalent bond between the first optical surface and the second optical surface, the second optical component comprising a metal halide $M'X'_m$ or a silica-containing material;

wherein when the second optical component comprises $M'X'_m$, the covalent bond includes a M-O-M' bridge; and wherein when the second optical component comprises a silica-containing material, the covalent bond includes a M-O—Si bridge.

2. The lens assembly of claim 1, wherein the second optical component is made of a metal halide $M'X'_m$ and the interfacing first and second optical surfaces are bonded by an M-O-M' bridge.

3. The lens assembly of claim 2, wherein the interfacing first and second optical surfaces are spherical or plano surfaces configured with <111> planes normal to the optical axis of the assembly, and the transverse crystal axes of the second optical component are rotated relative to those of the first optical component to reduce the intrinsic birefringence of the lens assembly.

4. The lens assembly of claim 1, wherein the second optical component is composed of silica, and the interfacing first and second surfaces are bonded by an M-O—Si bridge.

5. The lens assembly of claim 1, wherein the interfacing first and second optical surfaces are spherical or plano surfaces.

6. The lens assembly of claim 1, further comprising a third optical component including a third optical surface bonded to either the first optical component or the second optical component.

7. The lens assembly of claim 1, wherein the first optical component comprises calcium fluoride and the second optical component comprises silica.

8. The lens assembly of claim 1, wherein the first optical component comprises calcium fluoride and the second optical component comprises calcium fluoride.

9. A process for making a lens assembly having an optical axis comprising:

providing a first optical component having a first optical surface comprising a metal halide $MX_n$;

providing a second optical component having a second optical surface comprising a metal halide $M'X'_m$ or a silica-containing material;

applying a hydroxide solution to one or both of the first and second optical surfaces;

forming an interface between the first and second optical surfaces, wherein the hydroxide solution induces hydration of one or both of the first and second optical surfaces and formation of hydroxyl groups on one or both of the first and second optical surfaces; and dehydrating the interfacing first and second optical surfaces to form a covalent bond between the first and second optical surfaces, wherein when the second optical component comprises $M'X'_m$, the covalent bond includes a M-O-M' bridge; and wherein when the second optical component comprises a silica-containing material, the covalent bond includes a M-O—Si bridge.

10. The process of claim 9, wherein the second optical component is made of a metal halide $M'X'_m$ and the interfacing first and second optical surfaces are bonded by an M-O-M' bridge.

11. The process of claim 10, wherein the interfacing first and second optical surfaces are matching spherical or plano optical surfaces configured with <111> planes normal to the optical axis of the assembly, and the transverse crystal axes of the second optical component are rotated relative to those of the first optical component to reduce the intrinsic birefringence of the lens assembly.

12. The process of claim 9, wherein the second optical component is composed of silica, and the interfacing first and second optical surfaces are bonded by an M-O—Si bridge.

13. The process of claim 9, wherein the interfacing first and second optical surfaces are spherical or plano surfaces.

14. The process of claim 9, further comprising providing a third optical component having a third optical surface that matches a fourth optical surface of one of the first and second optical components, applying a hydroxide solution to the third optical surface, the fourth optical surface, or to both the third optical surface and the fourth optical surface, aligning the third optical surface with the fourth optical surface to form an interface between the third optical surface and fourth optical surface, and curing the interface between the third optical surface and the fourth optical surface, the curing forming a bond between the third optical surface and the fourth optical surface.

15. The process of claim 9, wherein the first optical component comprises calcium fluoride and the second optical component comprises silica.

16. The process of claim 9, wherein the first optical component comprises calcium fluoride and the second optical component comprises calcium fluoride.

17. A lens assembly, comprising:

a first optical component composed of silica or $MX_n$, wherein M is a Group 1 or Group 2 metal, X is a halide, and n is 1 if M is a Group 1 metal and n is 2 if M is a Group 2 metal, the first optical component having a convex spherical interfacial surface; and a second optical component composed of silica or $M'X'_m$, wherein M' is a Group 1 or Group 2 metal, X' is a halide, and m is 1 if M' is a Group 1 metal and m is 2 if M' is a Group 2 metal, the second optical component having a concave spherical interfacial surface covalently bonded with the convex spherical interfacial surface of the first optical component by an Si—O—Si, M-O—Si or M-O-M' bridge, wherein M and M' can be the same or different and X and X' can be the same or different.

18. The lens assembly of claim 17, wherein the first and second optical components are made of calcium fluoride and the convex and concave interfacial surfaces are bonded by Ca—O—Ca bridges.

19. The lens assembly of claim 18, wherein the lens components have matching plano or spherical optical surfaces at the interface, and are configured with <111> planes normal to the optical axis of the assembly, and the transverse crystal axes of the second optical component are rotated relative to those of the first optical component to reduce the intrinsic birefringence of the lens assembly.

20. The lens assembly of claim 17, wherein the first optical component is comprised of silica and the second optical component is composed of silica, and the convex and concave interfacial surfaces are bonded by Ca—O—Si bridges.

21. The lens assembly of claim 17, further comprising a third optical component including an interfacial optical surface bonded to an optical surface of either the first optical component or the second optical component.

* * * * *

UNITED STATES PATENT AND TRADEMARK OFFICE
CERTIFICATE OF CORRECTION

PATENT NO. : 11,340,383 B2
APPLICATION NO. : 16/156210
DATED : May 24, 2022
INVENTOR(S) : Michael Morgan Dunn et al.

It is certified that error appears in the above-identified patent and that said Letters Patent is hereby corrected as shown below:

On the Title Page

In Column 2, under "Other Publications", Line 3, delete "Microlighography," and insert -- Microlithography, --.

In Column 2, under "Other Publications", Line 4, delete "(2002))." and insert -- (2002). --.

Signed and Sealed this
Twentieth Day of September, 2022

Katherine Kelly Vidal
*Director of the United States Patent and Trademark Office*